United States Patent [19]

Naeem

[11] Patent Number: 6,002,136

[45] Date of Patent: Dec. 14, 1999

[54] MICROSCOPE SPECIMEN HOLDER AND GRID ARRANGEMENT FOR IN-SITU AND EX-SITU REPEATED ANALYSIS

[75] Inventor: Munir D. Naeem, Poughkeepsie, N.Y.

[73] Assignee: International Business Machines Corporation, Armonk, N.Y.

[21] Appl. No.: 09/074,964

[22] Filed: May 8, 1998

[51] Int. Cl.⁶ .................................................. H01J 37/20
[52] U.S. Cl. ....................... 250/442.11; 378/45; 378/83
[58] Field of Search ............................. 750/442.11, 310, 750/311, 306; 378/45, 83

[56] References Cited

U.S. PATENT DOCUMENTS

| | | | |
|---|---|---|---|
| 3,179,799 | 4/1965 | Valdre | 250/442.11 |
| 3,643,091 | 2/1972 | Lucas | 250/442.11 |
| 4,596,934 | 6/1986 | Yanaka et al. | 250/442.11 |
| 4,943,148 | 7/1990 | Mondragon et al. | 350/529 |
| 4,974,244 | 11/1990 | Torrisi et al. | 378/45 |
| 5,020,088 | 5/1991 | Tobin | 378/164 |
| 5,225,683 | 7/1993 | Suzuki et al. | 250/442.11 |
| 5,497,007 | 3/1996 | Uritsky et al. | 250/491.1 |
| 5,753,924 | 5/1998 | Swann | 250/442.11 |

FOREIGN PATENT DOCUMENTS 9-61440  3/1997  Japan .

OTHER PUBLICATIONS

C. F. Aliotta et al., Holder For Automatic Alignment of Large Wafers in a Scanning Electron Microscope, IBM Technical Disclosure Bulletin, vol. 26, No. 10B, pp. 5479–80 (1984).

R. G. Christensen et al., Mask Aligning Fixture for Silicon Wafers, IBM Technical Disclosure Bulletin, vol. 27, No. 4B, pp. 2383–84, pp. 2383–84 (1984).

Anonymous, Microscope Wafer Orientation Fixture, IBM Research Disclosure (Oct. 1985).

*Primary Examiner*—Kiet T. Nguyen
*Attorney, Agent, or Firm*—Ratner & Prestia; Tiffany L. Townsend

[57] ABSTRACT

A specimen holder and specimen grid orientation arrangement facilitating in-situ and ex-situ repeated analysis of a specimen in a microscope. The arrangement includes a specimen grid, to which the specimen is affixed, having an alignment aid. The arrangement also includes a specimen holder having an opening. The opening repeatedly receives and supports the specimen grid. A reference aid, located in the opening of the specimen holder, engages the alignment aid on the specimen grid to orient the specimen grid in a single position within the opening of the specimen holder. In specific embodiments, the alignment aid of the specimen grid may be a notch or an aperture; the reference aid of the specimen holder may be a raised surface or a pin.

21 Claims, 8 Drawing Sheets

MICROSCOPE SPECIMEN HOLDER AND GRID ARRANGEMENT FOR IN-SITU AND EX-SITU REPEATED ANALYSIS

TECHNICAL FIELD

The present invention relates generally to microscopy and, more particularly, to a specimen holder and grid arrangement used in electron beam microscopy to facilitate in-situ and ex-situ repeated analysis of the specimen.

BACKGROUND OF THE INVENTION

The examination and observation of specimens of submicron dimensions is of great interest to scientists and engineers doing research in the physical and biological sciences. It is also of great scientific value to study the effects of experimental treatments on such specimens and to examine any changes, modifications, transformations, and other effects that result from experimental treatments of these specimens. The specimens of interest are of extremely small dimensions and they can only be observed in very advanced microscopes such as transmission electron microscopes (TEM), scanning electron microscopes (SEM), atomic force microscopes (AFM), and other electronic or optical microscopes.

The process of finding objects such as point defects (or clusters of point defects), line defects (such as dislocations), planar defects (such as stacking faults), and other volume defects (such as voids) in a specimen requires a high-resolution microscope. The same requirement exists for biological specimens and for other materials science research in industry, including the semiconductor industry. Once these objects of interest are located in a specimen and observed in a microscope, it becomes equally important to study the effects of experimental treatments on the objects. Such study requires that the specimen be removed from the microscope and subjected to different ex-situ treatments such as plasma exposure, heat, or other chemical or physical treatment that cannot be performed on the specimen while it is in the microscope.

Removable specimen holding systems used to retain specimens for observation under microscopes are well known to those of skill in the art. More specifically, systems for holding silicon wafers (or portions of those wafers) having a plurality of semiconductor chips imprinted on the wafers for viewing under electron beam microscopes are well known. Such systems typically include a specimen mounting grid having a specimen mesh upon which the wafer or wafer portion (i.e., the specimen) is mounted. The specimen mounting grid is secured to a specimen holder (or platen) which, in turn, is positioned on the stage of the microscope. The orientations (1) between the specimen and the specimen grid, (2) between the specimen grid and the specimen holder, and (3) between the specimen holder and the microscope stage are all critically important. The prior art has addressed the first and third of these important orientations; the present invention is directed to the second orientation—the orientation between the specimen grid and the specimen holder.

A. Orientation Between Specimen & Specimen Grid

A relatively large number of references address orientation between the specimen and the specimen grid or equivalent structure. U.S. Pat. No. 4,943,148 issued to Mondragon et al. discloses, for example, a holder for positioning silicon wafers on a microscope stage. The device assures desired orientation between the specimen wafer and the structure holding the specimen (i.e., a specimen grid). Semiconductor processing quality control procedures require that each wafer be analyzed at an appropriate number of sites so that representative chips may be viewed to insure proper quality. Such analysis occurs under a SEM, with the sites selected by a computer-controlled stage onto which the wafer is placed.

In order to assure that identical sites are reviewed on successive wafers, the wafer must occupy the same position on the structure used to hold the wafer. The wafer should be positioned on the structure to within close tolerances, on the order of ±150 microns or less. Such uniform positioning of the wafer within the holding structure assures accurate and repeatable microscopic views. Calibration standards are built into the holding structure, reducing the time and variability incident to such calibration.

The wafers according to the device taught by Mondragon et al. have a major flat and at least one minor flat. A clamp affixed to a threaded member slides within a radially aligned slot so as to be aligned with the major flat. Therefore, rather than aligning the wafer against a pair of posts, the clamp pushes the leading edge of the wafer against a face, thereby self-aligning the wafer in the same position relative to the holding structure each time a wafer is placed in the holding structure.

Another reference which relies upon marks, scribes, notches, flats, or other structural alterations of the specimen itself to provide orientation is U.S. Pat. No. 5,497,007, issued to Uritsky et al. The Uritsky et al. patent discloses an automated method for determining the wafer coordinates in a SEM/EDX system. Semiconductor wafer characterization equipment typically includes a high-magnification imaging system such as a SEM coupled to an energy dispersive x-ray (EDX) detector. Such an imaging system, when used to scan a semiconductor wafer, provides information regarding particles and anomalies on the surface of the wafer. The combination of a SEM and an EDX within a common unit is generally known as a SEM/EDX unit.

A laser scanner creates a laser scan map of the coordinates of the wafer features and concomitant particles. This laser scan map uses the coordinate system of the laser scanning device, of course, to identify the location of surface features and particles. The manner in which the laser beam is scattered from the wafer surface features and particles yields signals from which estimated particle positions in terms of x and y coordinates can be determined. A computer controls the electron beam intensity, scan rate, and position relative to the coordinate system of the SEM/EDX unit (also the imaging system coordinate system).

Because the wafer is physically moved from the laser scanner to the imaging system, there is no way to guarantee that the coordinate system used in the laser scanner will apply when the wafer is moved to the imaging device. Thus, the wafer coordinate system must be related to the coordinate system of the SEM/EDX unit. The wafer coordinate system is defined by the location of the center of the wafer and the orientation angle of the wafer relative to the imaging system coordinate system. The orientation angle of the wafer is defined by the position of a significant wafer landmark, including a notch or flatted portion on the wafer itself. By relating the imaging coordinate system to the wafer coordinate system, the high-magnification imaging system can repeatedly find any location in the wafer coordinate system.

Typically, the wafer is maintained on the SEM stage by a specimen holder that is roughly the shape of the wafer and a spring-loaded pin (or key) that interacts with the edge of the wafer. The pin maintains the wafer in a stationery position within the specimen holder. An operator roughly aligns the specimen holder with predefined markings on the SEM stage. As such, each wafer that is analyzed is generally oriented in the same direction, i.e., the notch or flatted portion of the wafer points in roughly the same direction relative to the stage.

The method suggested by Uritsky et al. is only useful as long as the specimen stays in the microscope. When the specimen is removed for ex-situ treatment, the re-location of a previously identified defect or other object on the specimen would pose a problem. Uritsky et al. do not address that problem. Thus, there remains a need for improved orientation between the specimen grid and the specimen holder.

The automated method taught by Uritsky et al. permits a wafer to be arbitrarily oriented in the imaging system coordinate system "as long as the general location of the landmark region is known to the imaging system." Column 10, lines 60–63. The landmark region is a notch or flattened portion on the wafer itself. Frequently, the nature of specimens is such that they cannot be "marked" or "scribed" with notches, flats, or other physical characteristics. There also remains a need, therefore, for an orientation system which avoids structural alterations of the specimen itself.

Uritsky et al. address a SEM/EDX system. The orientation system currently available on advanced TEM systems allows specimen orientation only when the specimen is inside the microscope. Orientation is done by tracking the x-y coordinates using a computer and the repeated examination of any event is only possible as long as the specimen remains in the microscope. Such current systems are not very helpful if any defect or other artifact must be examined repeatedly to observe the effects of ex-situ processing or treatment such as plasma exposure. There remains a need, therefore, for a simple orientation system that would allow the tracking of a particular specimen site so that the site might be examined repeatedly after ex-situ processing.

In their article titled "Mask Aligning Fixture For Silicon Wafers," International Business Machines Technical Disclosure Bulletin No. FI882-0962, Vol. 27, No. 4B, pages 2383–84 (September 1984), authors R. Christensen and R. Imrie disclose a technique predicated on the use of a mask material that matches the coefficient of expansion of silicon. Such matching eliminates the need for compensated artwork. Like the devices taught by Mondragon et al. and Uritsky et al., however, the orientation structure disclosed by R. Christensen and R. Imrie requires modification of the wafer.

Specifically, the silicon wafer has fiducials or via holes which allow it to be oriented with respect to a mask. The mask is also marked for alignment purposes, having a "V" notch. The mask is located by two, straight mask registration pins separated by approximately 90 degrees on the periphery of the mask holder. One of the pins engages the V-shaped notch on the mask. The silicon wafer is held by vacuum and manipulated under the mask until the fiducials or the via holes are lined up, as viewed through a microscope. Cams are rotated until they touch the outer edge of the silicon wafer. The cams are locked in place by an impactor tool that wedges tapered pins into a tapered hold. Square holes in the cam that slide over the square shank of the locking pin prevent the cam from turning. A spring holds the mask in registration with the two mask registration pins. A wafer spring holds the silicon wafer against the cams. A wafer/mask spring is centered on the wafer. Then a spring clip top plate is placed over "U" clip posts. The entire assembly is clipped to the mask holder by "U" clips.

Thus, the apparatus and method disclosed by R. Christensen and R. Imrie align the wafer to the mask with the help of fiducials, vias, or other alignment marks on the wafer. The need for an orientation system which avoids structural alterations of the specimen itself has been discussed above. The authors are also not concerned with re-location of previously observed objects or defects on the specimen after ex-situ processing.

The conventional technique of structurally altering the wafer specimen to facilitate orientation is further illustrated by C. Aliotta, A. Constantino & G. Cia, "Holder For Automatic Alignment Of Large Wafers In A Scanning Electron Microscope," International Business Machines Technical Disclosure Bulletin No. YO882-0641, Vol. 26, No. 10B, pages 5479–80 (March 1984). The wafer is retained in a holder by three contact points along the wafer edge. A movable contact pin on the holder is spring-loaded and designed to fit into an alignment slot on the edge of the wafer. This engagement serves two purposes: (1) the slot allows each succeeding wafer to fit on the holder in the same orientation each time, and (2) the spring-loaded pin applies pressure to the stationary hold-down pins. Thus, the wafer is positioned and secured to the holder in one operation.

Typically, it is not possible to self-align a wafer in practice for automatic loading into a microscope. The delicate nature of the specimen often renders impossible the spring loading taught by Aliotta et al. to hold the specimen. Rather, an operator is required to load most specimens. Even with human specimen loading, the relatively bulky spring-loaded holder is not feasible because limited space exists in most microscopes to accommodate such a holder—especially given the need for x-y-z translational and theta rotational movement of the specimen.

Anonymous, "Microscope Wafer Orientation Fixture," International Business Machines, Research Disclosure No. 25815 at page 515 (October 1985), also illustrates the conventional technique of structurally altering the wafer specimen to facilitate orientation. The disclosure teaches a fixture for roughly orienting a semiconductor wafer within the field of view of an optical microscope. The fixture baseplate is mounted on the microscope stage and moves with the stage in the vertical direction of focusing, and in the x and y directions, if the microscope is so provided. The baseplate is provided with two or more sets of adapters for different sizes of wafers. Each set consists of a wafer holder and a template holder. Both the wafer holder and the template holder have pins and mating holes for fixing the wafer and template, relative to each other, both angularly and orthogonally in the x and y directions.

All wafers in the anonymous reference are provided with a chordal flat, a notch, or both structural features for angular orientation. A pointer affixed to the microscope overlies the template to permit a corresponding area of the wafer to be examined as the fixture is translated to a desired area, using the template as a coordinate address reference. The pins are used primarily to lock the wafer holder and template onto the base plate rather than for orientation purposes. The wafer is oriented using the chordal flat or a notch on the wafer itself.

B. Orientation Between Specimen Holder & Microscope

U.S. Pat. No. 4,596,934 issued to Yanaka et al. discloses an electron beam apparatus with an improved specimen holder. The apparatus seeks to reduce spherical aberration in the microscope by decreasing the working distance between the specimen supported on the specimen grid and the objective lens. This is accomplished by modifying the structure of the specimen holder while maintaining adequate rigidity and vibration insensitivity of the specimen holder. As a peripheral result, the modified specimen holder is more easily oriented to the column of the microscope.

Specifically, the specimen holder is provided with a cutout or thin region in the end which is inserted into the microscope. The very edge of the thin region has a notch located at its mid-point. The thin region allows the objective lens of the microscope to be placed closer to the specimen than when a thicker specimen holder is inserted; the thin region permits reduction in the working distance of the microscope. When the specimen holder is positioned in the microscope, the notch of the thin region of the specimen holder engages a wedge-like member fixedly mounted on the inner side wall of the microscope column. Such engagement supports the specimen holder stably despite the structural weakness of the thin region.

Although not discussed by Yanaka et al., the engagement between the specimen holder and the microscope column would also appear to help orient the specimen holder in the microscope. Yanaka et al. clearly do not address, nor is the apparatus disclosed by Yanaka et al. applicable to, the problem of orientation between the specimen grid and the specimen holder. Accordingly, specimen orientation and re-examination of previously detected artifacts or defects on the specimen following ex-situ processing remains an issue both unrecognized and unsolved by Yanaka et al.

The deficiencies of the conventional microscope orientation systems show that a need still exists for a system that facilitates in-situ and ex-situ repeated analyses of a specimen. To overcome the shortcomings of the conventional systems, a new microscope specimen holder and grid arrangement is provided. An object of the present invention is to permit repeated orientation between the specimen holder and the specimen grid, allowing the specimen grid to be removed from the specimen holder and replaced in the specimen holder in precisely the same location following ex-situ processing of the specimen affixed to the specimen grid. Such a system assures easy relocation of a specimen feature after repeated ex-situ and in-situ experiments, treatments, or processes. A related object is to provide a relatively simple orientation system that allows the tracking of a particular specimen site so that the site might be examined repeatedly after ex-situ processing.

An additional object of the present invention is to modify the conventional specimen holder structure while maintaining adequate rigidity and vibration insensitivity of the specimen holder. Yet another object of the invention is to provide a flexible orientation system that permits the specimen to be tilted and translated while in the microscope. Such a system allows the operator to take advantage, without restriction, of all possible horizontal, vertical, and angular motions of the microscope for observation of the specimen while using the orientation system of the present invention. A related object is to provide an orientation system that can be used in all types of microscopes. Finally, it is still another object of the present invention to avoid marks, scribes, notches, flats, or other structural alterations of the specimen itself.

SUMMARY OF THE INVENTION

To achieve these and other objects, and in view of its purposes, the present invention provides a specimen holder and specimen grid orientation arrangement facilitating in-situ and ex-situ repeated analysis of a specimen in a microscope. The arrangement includes a specimen grid, to which the specimen is affixed, having an alignment aid. The arrangement also includes a specimen holder having an opening. The opening repeatedly receives and supports the specimen grid. A reference aid, located in the opening of the specimen holder, engages the alignment aid on the specimen grid to orient the specimen grid in a single position within the opening of the specimen holder.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
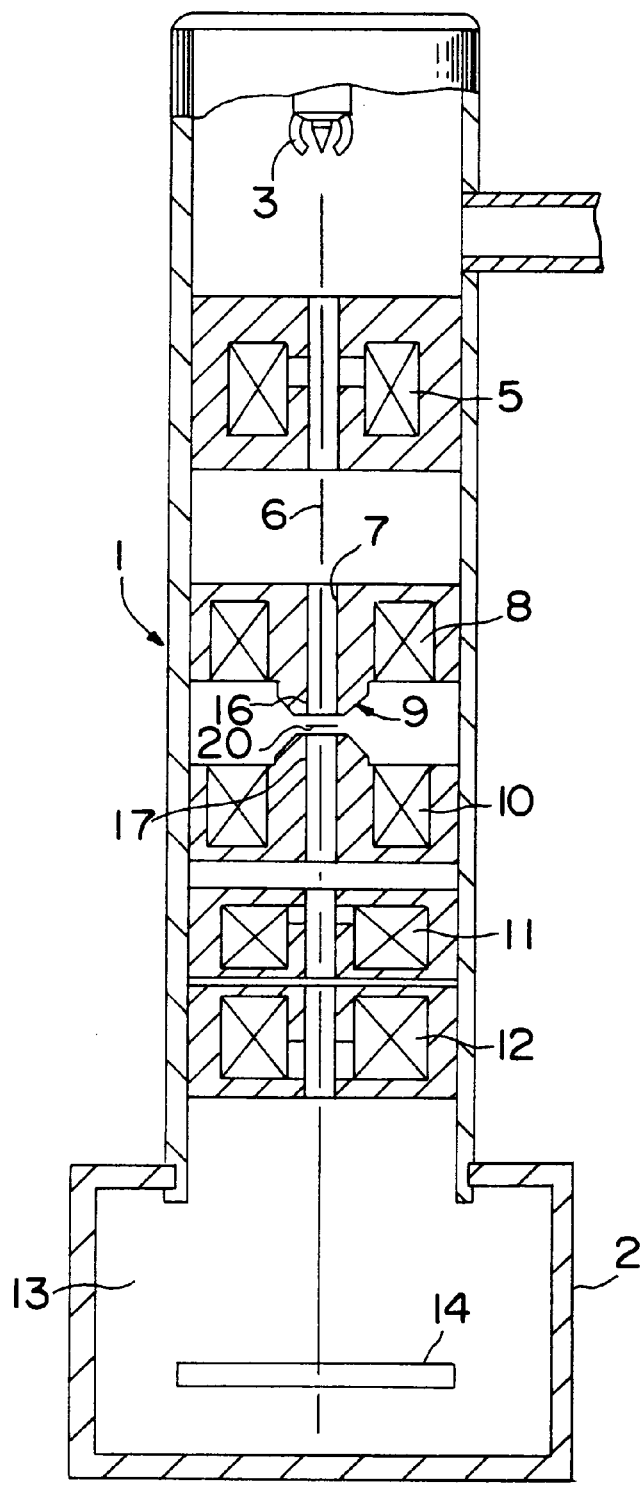
FIG. 1 shows in a sectional view the structure of a conventional transmission electron microscope.

The present invention may be used in connection with any conventional microscope, including advanced electron beam apparatus such as a TEM (Transmission Electron Microscope), SEM (Scanning Electron Microscope), AFM (Atomic Force Microscope),or DFM (Dynamic Force Microscope). For purposes of example only, a typical TEM structure is shown in FIG. 1.

The illustrated TEM has a microscope column 1 which includes an electron gun 3; a condenser lens 5; an objective lens 9 provided with excitation coils 8 and 10 and disposed below the condenser lens 5; an intermediate lens 11 and a projection lens 12, both located below the objective lens 9; and a viewing chamber enclosure 2. The viewing chamber enclosure 2 is mounted in a fixed position below the microscope column 1 and defines a hollow chamber 13 in which a fluorescent screen 14 is disposed. A center bore 7 is formed in the microscope column 1 and extends longitudinally along a beam or optical axis 6. Electrons emitted by the electron gun 3 travel along optical axis 6. The objective lens 9 includes an upper magnetic pole piece 16 excited by the excitation coil 8 and a lower magnetic pole piece 17 disposed a predetermined distance below the upper magnetic pole piece 16 and excited by the excitation coil 10. A specimen holding system 20 is inserted in and can be withdrawn from the space defined between the upper magnetic pole piece 16 and the lower magnetic pole piece 17.

Figure 2:
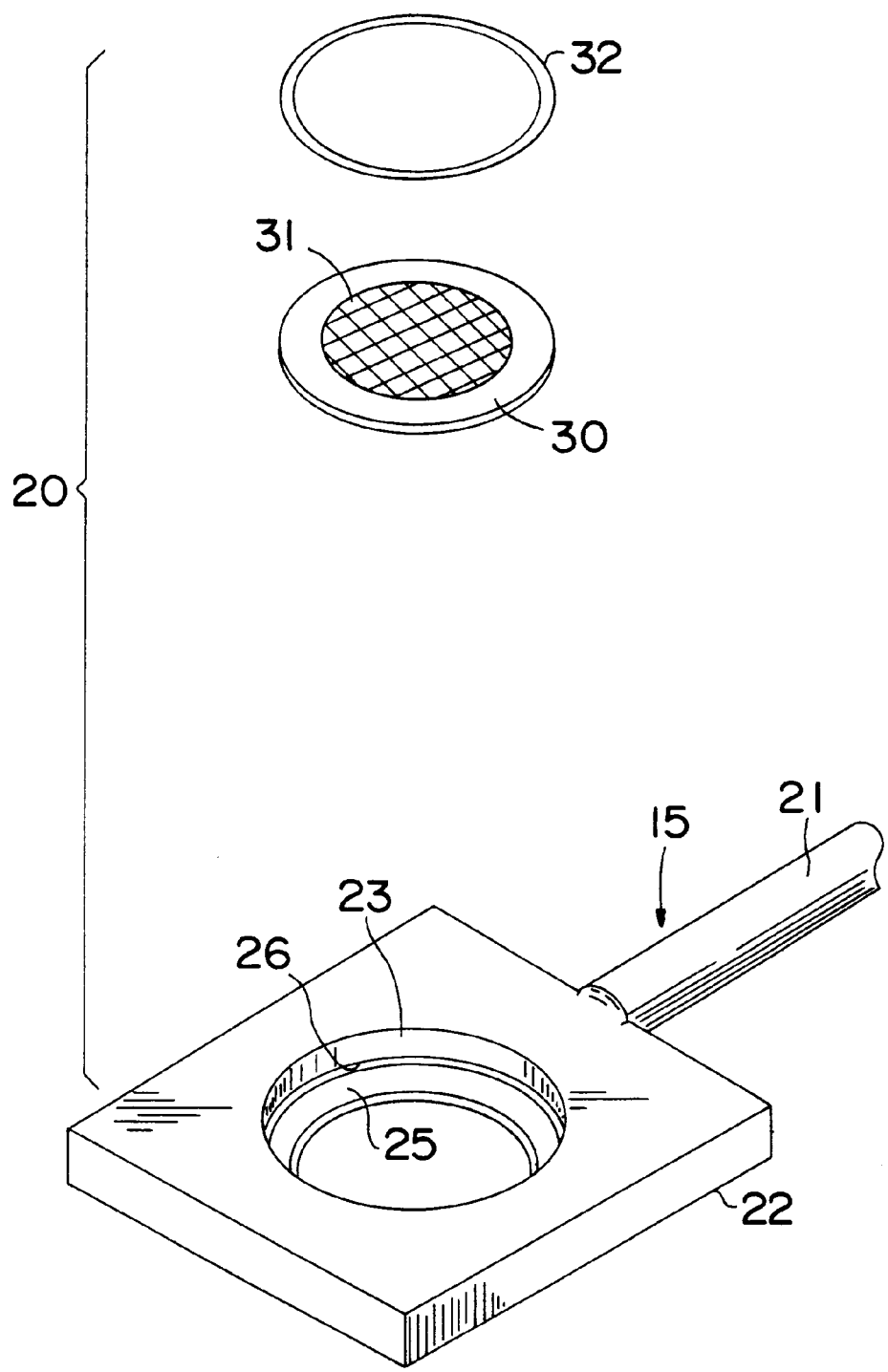
FIG. 2 is a perspective, exploded view showing a conventional specimen holding system for an electron beam apparatus such as the TEM illustrated in FIG. 1.

A conventional specimen holding system 20 is shown in FIG. 2. The specimen holding system 20 has a specimen holder 15, a specimen mounting grid 30 disposed on the specimen holder 15, and a ring-like mesh retaining spring 32 for retaining fixedly the specimen mounting grid 30. The specimen holder 15 has a holding rod 21, which is rotatably supported in a side wall of the microscope column 1, and a platen 22 formed integrally with and at an end of the holding rod 21. Formed substantially at the center of the platen 22 is a hole 23 of a circular shape which has a diameter greater than that of the end face of the magnetic pole pieces 16, 17 of the objective lens 9. An annular ledge 25 is formed at the lower end of the hole 23 and extends radially inward from the inner peripheral wall of the hole 23. Further, a peripheral groove 26 is formed in the side wall of the hole 23. The holding rod 21 of the specimen holder 15 has a cylindrical configuration so that it can be rotated about its longitudinal axis. The platen 22 has the form of a plate with an overall thickness of 2 to 3 mm.

The specimen mounting grid 30 may be made of a synthetic resin or conductive metal, is about 0.2 mm thick and 3 mm in diameter, and encloses a specimen mesh 31. The specimen mesh 31 physically supports the specimen, which is glued or otherwise semi-permanently mounted to the specimen mounting grid 30, and allows the electron beam to transmit through the annular specimen mounting grid 30. The specimen mounting grid 30 is disposed on the ledge 25 of the platen 22 with the outer peripheral edge of the specimen mounting grid 30 fitted in the groove 26. Further, the retaining spring 32 is press-fitted on the specimen mounting grid 30 to hold the specimen mounting grid 30 in position in the platen 22. In operation, a specimen to be examined is disposed on the specimen mesh 31, the specimen mounting grid 30 is positioned and held in the hole 23 of the platen 22 of the specimen holder 15, and the specimen holder 15 is inserted and displaced toward the inter-pole gap in the direction perpendicular to the optical axis 6 of microscope column 1.

A TEM such as that illustrated in FIG. 1 can track any particular object (e.g., a defect, grain, or other artifact) on the specimen only as long as the specimen is positioned inside the microscope. Tracking is done using x-y coordinates. When the specimen is inside the microscope, its location can be tracked and stored in the memory of a computer controlling the specimen movement by its x-y coordinates. The x-y coordinate information is lost and the tracking of a specific feature becomes extremely difficult, however, once the specimen is removed from the microscope. Such tracking is important to facilitate the repeated examination of certain features which is necessary to see the effects of ex-situ experiments or processing including, for example, the plasma exposure of metals.

In addition, the nature of silicon wafer specimens is such that it is typically disadvantageous to mark or scribe them with notches, flats, or other physical characteristics. Wafers are generally circular and are relatively thin (about 200–800 micrometers) and fragile; they have a large number of semiconductor chips (typically 220 to 600 chips per wafer) imprinted on them and have varying diameters ranging between 50 to 300 mm. Techniques such as lasers or focused ion beams (FIB) are often applied to mark or scribe wafers. Such physical alterations may weaken the wafer. Perhaps more deleterious, however, is the area of the wafer required to accommodate such alterations. The amount of space available for placement of semiconductor chips on the wafer must be maximized and, preferably, should not be devoted to orientation marks or scribes. In addition, microscope specimens are typically small portions of wafers rather than entire wafers—for which the disadvantages of marking or scribing are exacerbated.

The present invention provides an orientation system that overcomes these difficulties. Specifically, the system of the present invention permits repeated examination of certain features, as necessary to see the effects of ex-situ experiments or processing on those features, while avoiding structural alterations, resulting from physical markings, of the specimen itself. These advantages are achieved by placing the orientation system on the specimen holder and on the specimen grid. Contrast the conventional techniques which place orientation systems either (1) between the specimen and the specimen grid, or (2) between the specimen holder and the microscope.

The system of the present invention is primarily useful in holding semiconductor wafers or portions of those wafers because the system was developed for that specific purpose. It should be understood, however, that the system could be applied to observe any planar object for which precision is required in the placement of the object in the microscope field of view. Moreover, the system can be used with specimens having irregular geometries. The system can also be used with a number of suitable microscopes.

Figure 3:
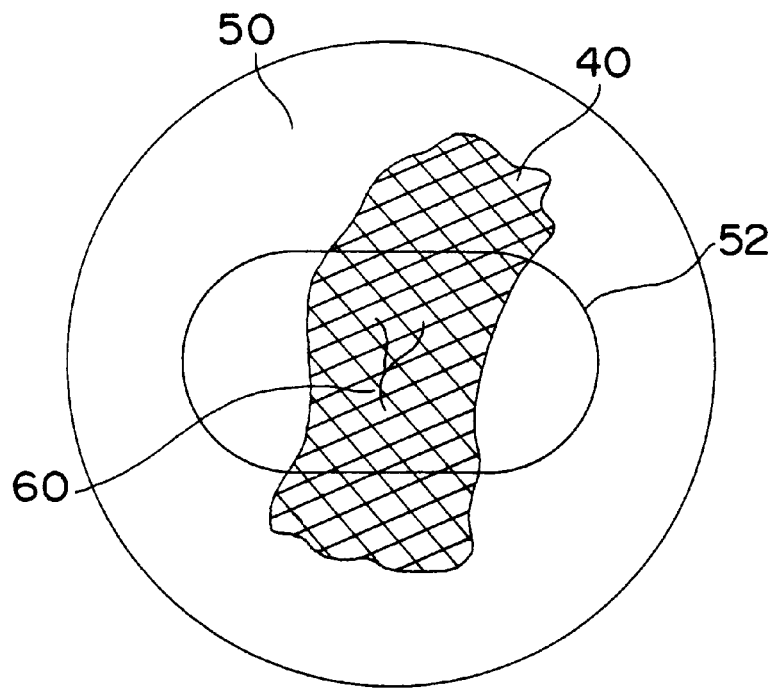
FIG. 3 shows an exemplary specimen, having a defect of interest, in position on a conventional microscope specimen grid.

In the particular case of a TEM such as that illustrated in FIG. 1, a specimen 40 is thinned to a certain dimension to render the specimen 40 transparent to the electron beam. The specimen thinning process is tedious and consumes time. Once the specimen 40 is thinned, it is mounted on a TEM specimen grid 50 which has a hole 52 with the boundary outlined as shown in FIG. 3. The specimen 40 on the specimen grid 50 is placed in a TEM specimen holder (not shown in FIG. 3) and the examination of the specimen 40 is performed in the microscope. Suppose that there is a particular random crystal defect 60 (a dislocation, for example) in the material of the specimen 40 which is observed during a routine examination. The defect 60 can be examined in detail from different angles and by moving it away from or into the focus of the electron beam by recording its coordinates (x-y coordinates) in the computer memory of the microscope.

Often, it is of interest to see how the defect 60 changes or transforms as a result of some external treatment (e.g., plasma exposure). The TEM specimen grid 50 with the specimen 40 containing a defect 60 must be removed both from the TEM and from the TEM specimen holder in order for the specimen 40 to be exposed to plasma in other equipment. Once the specimen grid 50 (with specimen 40 and its defect 60) is removed from the specimen holder and an external plasma exposure protocol is complete, the re-examination of defect 60 is desired. The x-y coordinate information is lost, however, once the specimen grid 50 is removed from the TEM specimen holder which was taken out of the microscope. Therefore, relocation of the defect 60 on the specimen grid 50 is made difficult (if not impossible) while reloading the specimen grid 50 (with specimen 40 and defect 60) after ex-situ plasma exposure. The specimen grid 50 cannot be placed on the specimen holder in exactly the same position as it was during the in-situ examination in the microscope before ex-situ plasma treatment.

The orientation system of the present invention provides an alignment aid or marks on the specimen grid 50 along with corresponding reference aids or marks on the TEM specimen holder. This system allows the specimen grid 50 to be replaced in the specimen holder, after processing, in a position very close to the position that the specimen grid occupied before processing. Accordingly, the defect 60 on the specimen 40 attached to the specimen grid 50 can be relocated easily to ascertain the effects of processing on the defect 60.

Figure 4A:
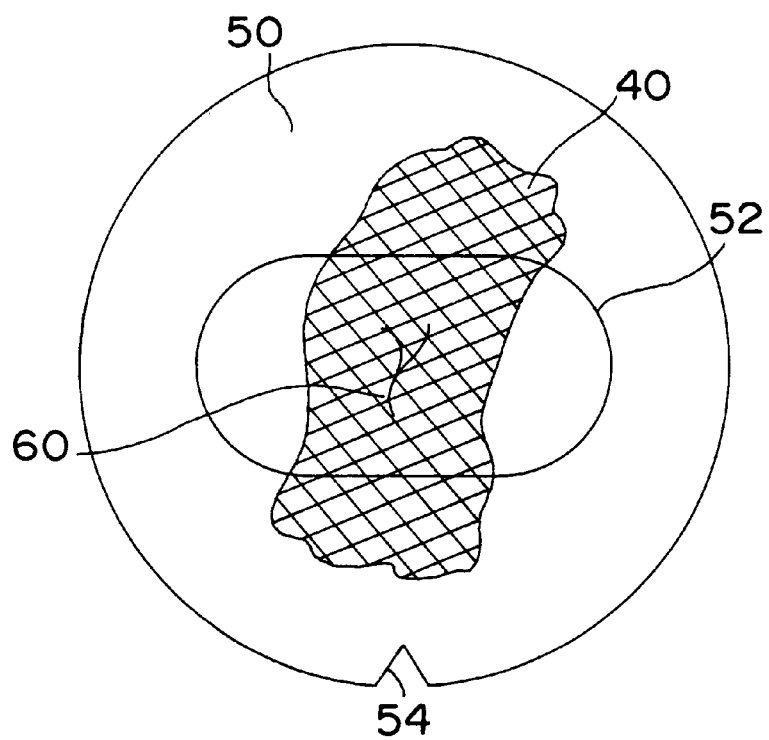
FIG. 4A shows a first embodiment of the microscope specimen grid according to the present invention, the specimen grid having a notch.
Figure 4B:
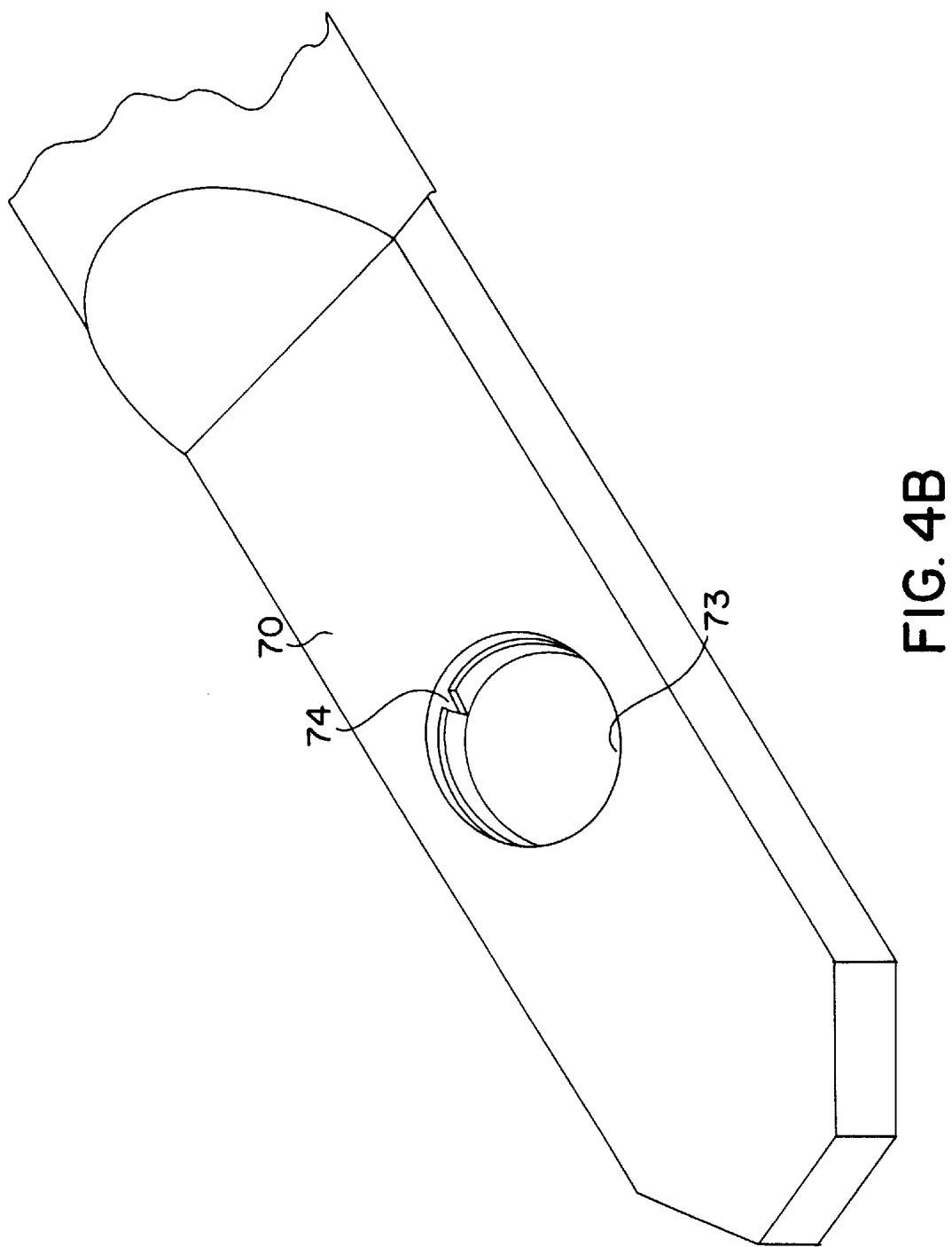
FIG. 4B shows a microscope specimen holder having an opening with a raised surface in accordance with the first embodiment of the present invention, the specimen holder adapted to mate with the specimen grid shown in FIG. 4A.
Figure 6:
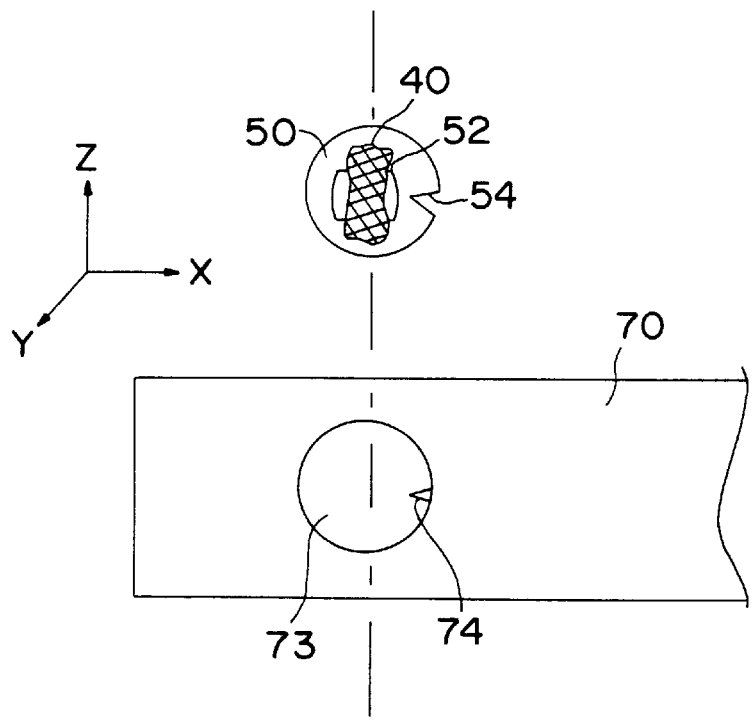
FIG. 6 illustrates the alignment between the specimen grid (having a notch) and the specimen holder (having an opening with a raised surface) of the first embodiment according to the present invention.

In a first embodiment of the present invention, a notch 54 is provided in the TEM specimen grid 50 supporting the specimen 40 as illustrated in FIG. 4A. The notch 54 can be V-shaped, as illustrated, or more rounded in shape. The notch 54 has a length of about 0.2 to 0.5 mm and a maximum width (at its base opposite its tip) also of about 0.2 to 0.5 mm. A corresponding notch, groove, ridge, or raised surface 74 is provided in the opening 73 in the TEM specimen holder 70. The defect 60 in the specimen 40 can be observed (before any experimental treatment) in the microscope when the specimen grid 50 of FIG. 4A is seated in the opening 73 of the TEM specimen holder 70 of FIG. 4B and the notch 54 on the specimen grid 50 is butted against the raised surface 74 in the opening 73 in the TEM specimen holder 70. FIG. 6 illustrates the alignment between the specimen grid 50 (having a notch 54) and the specimen holder 70 (having an opening 73 with a raised surface 74) of the first embodiment according to the present invention.

Once the random artifact or defect 60 is found and examined, the specimen grid 50 can be taken out of the opening 73 of the specimen holder 70. The specimen grid 50 with the specimen 40 on it can be subjected to any desired ex-situ treatment and returned to the opening 73 of the specimen holder 70 after the treatment is complete while ensuring that the notch 54 on the specimen grid 50 and the raised surface 74 in the opening 73 of the specimen holder 70 are properly butted against or engaged with each other.

This engagement provides a coarse alignment or orientation between the specimen grid 50 and the specimen holder 70. Consequently, the previously identified defect 60 can be relocated easily using low magnification in the microscope. Then, after finer alignment using the x-y coordinates of the microscope, the defect 60 can be reexamined to ascertain the effects of treatments such as plasma processing. The depth in the z-direction of the orientation system of the present invention allows the specimen to be tilted and translated while in the microscope.

Figure 5A:
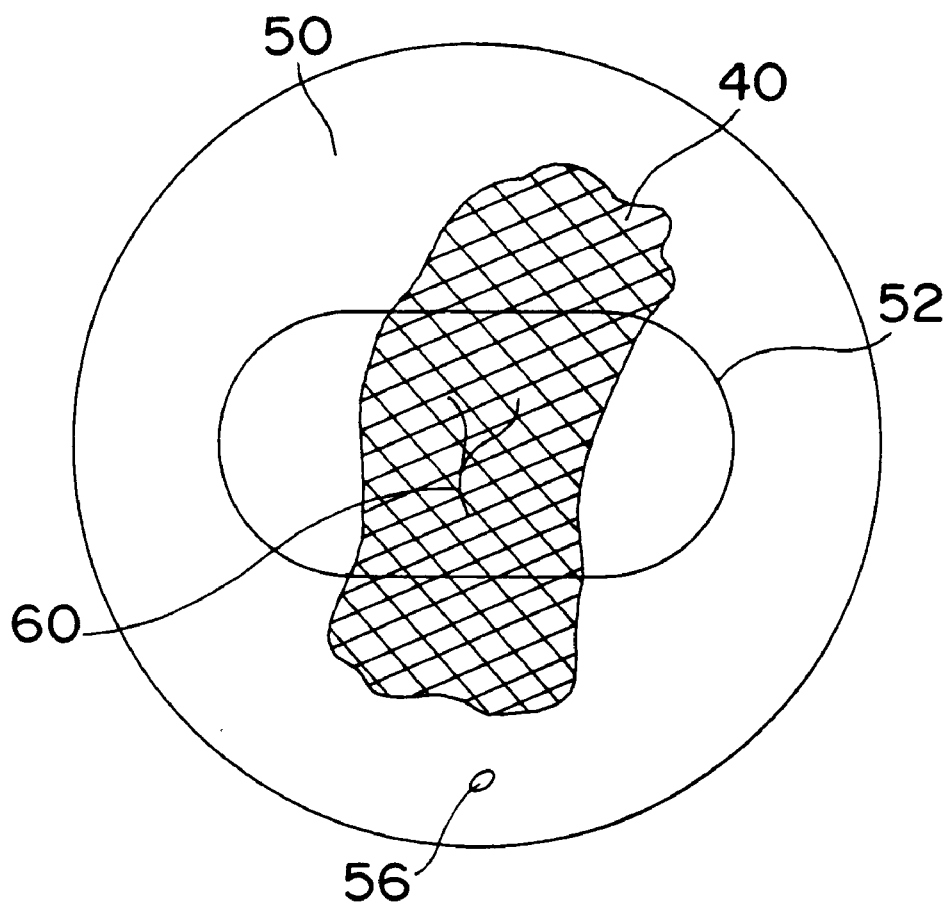
FIG. 5A shows a second embodiment of the microscope specimen grid according to the present invention, the specimen grid having an aperture.
Figure 5B:
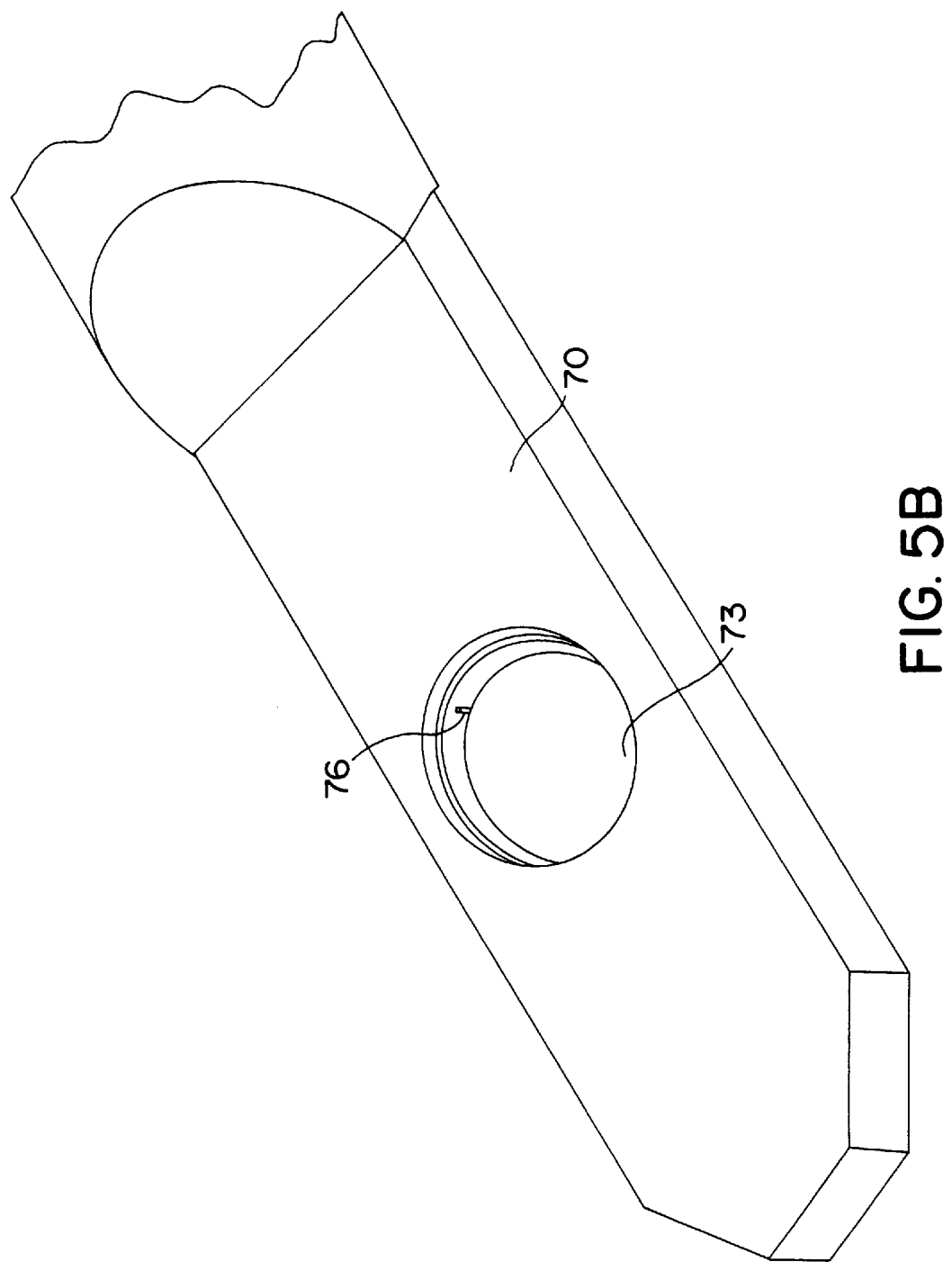
FIG. 5B shows a microscope specimen holder having an opening with a raised pin in accordance with the second embodiment of the present invention, the specimen holder adapted to mate with the specimen grid shown in FIG. 5A.
Figure 7:
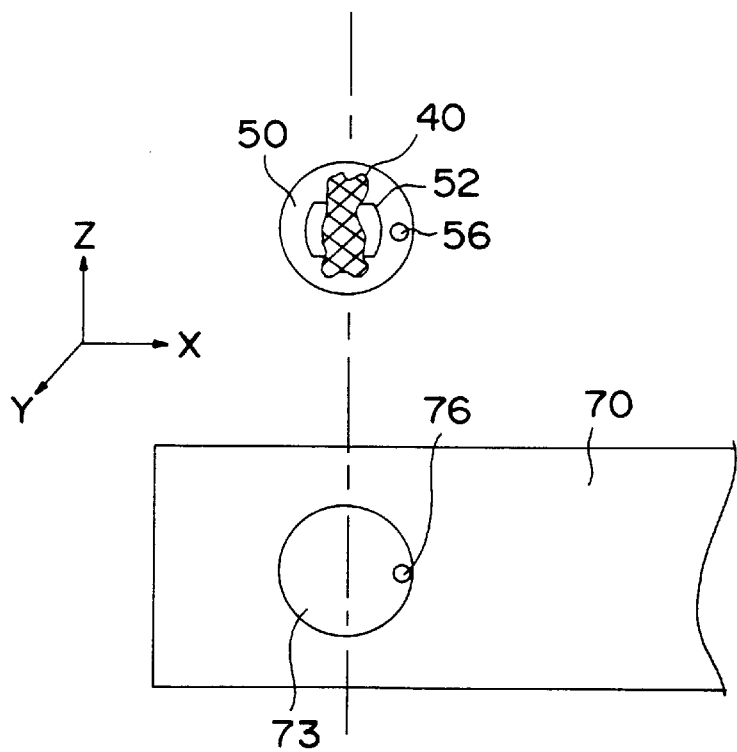
FIG. 7 illustrates the alignment between the specimen grid (having an aperture) and the specimen holder (having a pin) of the second embodiment according to the present invention.

FIG. 5A shows a second embodiment of the microscope specimen grid 50 according to the present invention. In this embodiment, the specimen grid 50 has an aperture 56. A corresponding pin 76 in the opening 73 of the TEM specimen holder 70 is shown in FIG. 5B. The pin 76 of the TEM specimen holder 70 is sized and shaped to pass through the aperture 56 in the specimen grid 50. Typically, the pin 76 is a round cylinder having a diameter of about 0.1 to 0.3 mm. FIG. 7 illustrates the alignment between the specimen grid 50 (having an aperture 56) and the specimen holder 70 (having a pin 76) of the second embodiment according to the present invention.

Figure 8A:
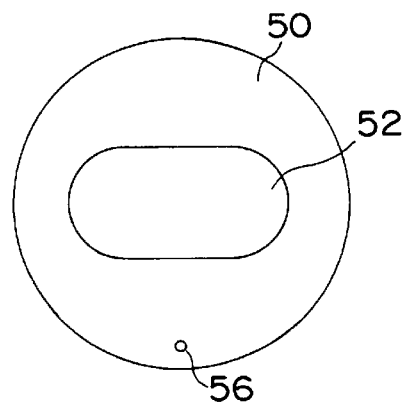
FIG. 8A shows a specimen grid having an aperture and an oblong hole.
Figure 8B:
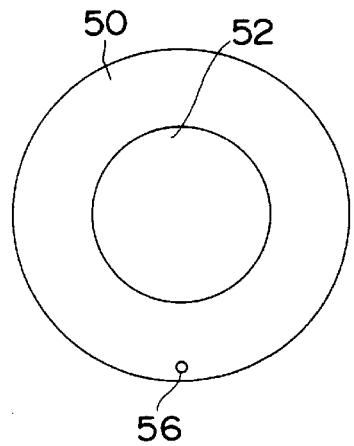
FIG. 8B shows a specimen grid having an aperture and a round hole.
Figure 8C:
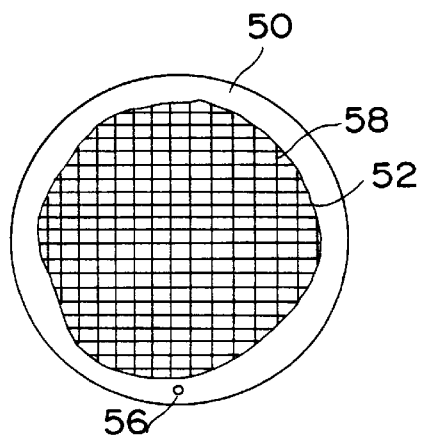
FIG. 8C shows a specimen grid having an aperture and a mesh grid.

The orientation system of the present invention can be applied to any specimen grid 50 having a variety of different hole shapes or meshes to provide specimen transparency to the electron beam. Some examples of suitable shapes for hole 52 (as opposed to aperture 56) are shown in FIGS. 8A (oblong) and 8B (round). Examples of different types of specimen grids are shown in FIGS. 8B and 8C. FIG. 8B illustrates a through hole 52; FIG. 8C illustrates a specimen grid 50 having a hole 52 and a mesh grid 58.

Similarly, the system can be used in connection with different types of specimen holders 70 such as heated, double tilt, spring-loaded (although not preferred given space limitations), and reflection-deflection. The system does not require any additional attachments, base plates or any other changes leading to any increases in size for the specimen holder (or, similarly, for the specimen grid). Such specimen holders can have openings 73 with a variety of shapes or geometries. The specimen holder 70 has a thickness, as viewed in the axial direction of the microscope, of about 2 mm. This thickness is required so that the specimen holder 70 can fix the specimen grid 50 in position, can secure a holding rod for inclining or angularly positioning the specimen, and can possess sufficient rigidity and vibrational insensitivity for practical applications.

The orientation system of the present invention provides an alignment mechanism that assures easy relocation of a feature after repeated ex-situ and in-situ experiments, treatments, or processes. The system can also be used in all types of microscopes. The system offers the additional degree of freedom of tilting the specimen 40 in the microscope. Finally, the system maintains the flexibility of permitting z-translation of the specimen 40 in the microscope. The operator can take advantage, without restriction, of all possible horizontal, vertical, and angular motions of the microscope for observation of the specimen 40 while using the orientation system of the present invention.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. As an example, a single alignment aid (notch or aperture) has been illustrated on the specimen grid to engage a single reference aid (raised surface or pin) on the specimen holder. Multiple such alignment and reference aids could be incorporated on the specimen grid and specimen holder, respectively.

What is claimed:

1. A specimen holder and specimen grid orientation arrangement facilitating in-situ and ex-situ repeated analysis of a specimen in a microscope, the arrangement comprising:

a specimen grid, to which the specimen is affixed, having an alignment aid; and a specimen holder having an opening, which repeatedly receives and supports the specimen grid such that the specimen grid lies substantially flat in the specimen holder, and a reference aid located in the opening, the reference aid engaging the alignment aid on the specimen grid to orient the specimen grid in a single position within the opening of the specimen holder.

2. The arrangement of claim 1 wherein the arrangement is adapted to facilitate in-situ and ex-situ repeated analysis of a specimen that is devoid of alignment marks.

3. The arrangement of claim 1 wherein the alignment aid on the specimen grid is a notch and the reference aid on the specimen holder is a raised surface.

4. The arrangement of claim 3 wherein the notch has a length of about 0.2 to 0.5 mm.

5. The arrangement of claim 1 wherein the alignment aid on the specimen grid is an aperture and the reference aid on the specimen holder is a pin.

6. The arrangement of claim 5 wherein the pin has a diameter of about 0.1 to 0.3 mm.

7. The arrangement of claim 1 wherein the engagement between the alignment aid on the specimen grid and the reference aid on the specimen holder permits the specimen to be tilted and translated while in the microscope.

8. The arrangement of claim 1 wherein the microscope is one of a transmission electron microscope, a scanning electron microscope, and an atomic force microscope.

9. The arrangement of claim 1 wherein the specimen grid has multiple alignment aids and the specimen holder has a corresponding number of reference aids.

10. A specimen holder and specimen grid orientation arrangement facilitating in-situ and ex-situ repeated analysis in a microscope of a generally planar wafer devoid of alignment marks, the arrangement comprising:

a specimen grid, to which the wafer is affixed, having a notch with a length of about 0.2 to 0.5 mm; and a specimen holder having an opening, which repeatedly receives and supports the specimen grid such that the specimen grid lies substantially flat in the specimen holder, and a raised surface located in the opening, the raised surface engaging the notch on the specimen grid to orient the specimen grid in a single position within the opening of the specimen holder while permitting the wafer to be tilted and translated while in the microscope.

11. The arrangement of claim 10 wherein the microscope is one of a transmission electron microscope, a scanning electron microscope, and an atomic force microscope.

12. The arrangement of claim 10 wherein the specimen grid has multiple notches and the specimen holder has a corresponding number of raised surfaces.

13. A specimen holder and specimen grid orientation arrangement facilitating in-situ and ex-situ repeated analysis in a microscope of a generally planar wafer or wafer portion devoid of alignment marks, the arrangement comprising:

a specimen grid, to which the wafer is affixed, having an aperture; and a specimen holder having an opening, which repeatedly receives and supports the specimen grid such that the specimen grid lies substantially flat in the specimen holder, and a pin with a diameter of about 0.1 to 0.3 mm located in the opening, the pin engaging the aperture in the specimen grid to orient the specimen grid in a single position within the opening of the specimen holder while permitting the wafer to be tilted and translated while in the microscope.

14. The arrangement of claim 13 wherein the microscope is one of a transmission electron microscope, a scanning electron microscope, and an atomic force microscope.

15. The arrangement of claim 13 wherein the specimen grid has multiple apertures and the specimen holder has a corresponding number of pins.

16. An electron beam microscope facilitating in-situ and ex-situ repeated analysis of a specimen, the microscope comprising:

a frame;

a lens supported by and located in the frame;

a specimen grid, to which the specimen in affixed, having an alignment aid;

a specimen holder having:
(a) an opening which repeatedly receives and supports the specimen grid such that the specimen grid lies substantially flat in the specimen holder,
(b) a reference aid located in the opening, the reference aid engaging the alignment aid on the specimen grid to orient the specimen grid in a single position within the opening of the specimen holder, and
(c) a holding portion rotatably supported in the frame and used to position the specimen holder, with the specimen grid supported in the opening of the specimen holder, within the frame and under the lens; and an electron gun supported by and located in the frame, the electron gun directing an electron beam through the lens and toward the specimen affixed to the specimen grid.

17. The microscope of claim 16 wherein the microscope is adapted to facilitate in-situ and ex-situ repeated analysis of a specimen that is devoid of alignment marks.

18. The microscope of claim 16 wherein the alignment aid on the specimen grid is a notch and the reference aid on the specimen holder is a raised surface.

19. The microscope of claim 16 wherein the alignment aid on the specimen grid is an aperture and the reference aid on the specimen holder is a pin.

20. The microscope of claim 16 wherein the engagement between the alignment aid on the specimen grid and the reference aid on the specimen holder permits the specimen to be tilted and translated while in the microscope.

21. The microscope of claim 16 wherein the specimen grid has multiple alignment aids and the specimen holder has a corresponding number of reference aids.

* * * * *